US006995545B2

(12) United States Patent
Tracy et al.

(10) Patent No.: US 6,995,545 B2
(45) Date of Patent: Feb. 7, 2006

(54) CONTROL SYSTEM FOR A SPUTTERING SYSTEM

(75) Inventors: Mark D. Tracy, Rochester, NY (US); Jesse N. Klein, West Henrietta, NY (US)

(73) Assignee: MKS Instruments, Inc., Wilmington, MA (US)

( * ) Notice: Subject to any disclaimer, the term of this patent is extended or adjusted under 35 U.S.C. 154(b) by 149 days.

(21) Appl. No.: 10/642,505

(22) Filed: Aug. 18, 2003

(65) Prior Publication Data

US 2005/0040794 A1   Feb. 24, 2005

(51) Int. Cl.
*H02P 9/10* (2006.01)
*H02P 9/44* (2006.01)
*H02P 9/04* (2006.01)
*H02P 9/00* (2006.01)
*H02P 11/00* (2006.01)

(52) U.S. Cl. .......................... 322/45; 322/19; 322/20; 322/22; 322/36; 322/37

(58) Field of Classification Search ................. 322/45, 322/17, 19, 20–22, 36–37
See application file for complete search history.

(56) References Cited

U.S. PATENT DOCUMENTS

| | | | | |
|---|---|---|---|---|
| 3,569,777 A | * | 3/1971 | Beaudry ................ 315/111.21 |
| 3,757,733 A | * | 9/1973 | Reinberg .................... 118/725 |
| 3,824,624 A | * | 7/1974 | Carlson et al. ................ 708/3 |
| 3,825,732 A | * | 7/1974 | Haley et al. .................. 703/18 |
| 3,826,906 A | * | 7/1974 | Carlson et al. ............... 703/18 |
| 3,829,667 A | * | 8/1974 | Carlson et al. ............... 703/18 |
| 3,829,669 A | * | 8/1974 | Haley et al. .................. 703/18 |
| 3,832,533 A | * | 8/1974 | Carlson et al. ................ 703/3 |
| 3,832,534 A | * | 8/1974 | Carlson et al. ............... 703/18 |
| 3,833,927 A | * | 9/1974 | Carlson et al. ................ 708/3 |
| 3,857,027 A | * | 12/1974 | Carlson et al. ............... 703/18 |
| 3,863,270 A | * | 1/1975 | Haley et al. .................... 708/3 |
| 3,867,216 A | * | 2/1975 | Jacob .......................... 438/725 |
| 4,115,184 A | * | 9/1978 | Poulsen ......................... 438/5 |
| 4,207,137 A | * | 6/1980 | Tretola ........................ 438/10 |
| 4,471,399 A | * | 9/1984 | Udren .......................... 361/64 |
| 4,629,940 A | * | 12/1986 | Gagne et al. ........... 315/111.51 |
| 4,719,551 A | * | 1/1988 | Nishizawa et al. ........... 363/41 |
| 4,902,394 A | | 2/1990 | Kenmotsu et al. ..... 204/192.12 |
| 4,990,859 A | * | 2/1991 | Bouyer et al. .............. 324/649 |
| 4,996,646 A | | 2/1991 | Farrington .................. 364/483 |
| 5,166,887 A | | 11/1992 | Farrington et al. ......... 364/483 |
| 5,170,360 A | | 12/1992 | Porter et al. ................ 364/483 |
| 5,198,746 A | * | 3/1993 | Gyugyi et al. .............. 323/207 |
| 5,278,773 A | * | 1/1994 | Cousineau .................. 700/287 |
| 5,422,826 A | * | 6/1995 | Cousineau .................. 700/287 |

(Continued)

FOREIGN PATENT DOCUMENTS

DE          44 20 951         12/1995

(Continued)

OTHER PUBLICATIONS

Cobine, *Gaseous Conductors, Theory and Engineering Applications*, (1958) Chapter 8, "Glow Discharges," pp. 205-289.

(Continued)

*Primary Examiner*—Darren Schuberg
*Assistant Examiner*—Pedro J. Cuevas
(74) *Attorney, Agent, or Firm*—Proskauer Rose LLP

(57) ABSTRACT

A fault handling algorithm processes a plurality of fault status signals from a sputtering system in a period of time to generate at least one command signal for affecting the operation of a power generator.

33 Claims, 4 Drawing Sheets

U.S. PATENT DOCUMENTS

| | | | | |
|---|---|---|---|---|
| 5,424,691 A | * | 6/1995 | Sadinsky | 333/17.3 |
| 5,505,835 A | | 4/1996 | Sakaue et al. | 204/192.26 |
| 5,554,809 A | | 9/1996 | Tobita et al. | 73/700 |
| 5,584,974 A | | 12/1996 | Sellers | 204/192.13 |
| 5,616,224 A | | 4/1997 | Boling | 204/298.08 |
| 5,645,698 A | | 7/1997 | Okano | 204/192.12 |
| 5,651,865 A | | 7/1997 | Sellers | 204/192.13 |
| 5,652,485 A | * | 7/1997 | Spiegel et al. | 318/147 |
| 5,664,066 A | | 9/1997 | Sun et al. | 395/23 |
| 5,711,843 A | | 1/1998 | Jahns | 156/345 |
| 5,718,813 A | | 2/1998 | Drummond et al. | 204/192.12 |
| 5,754,033 A | * | 5/1998 | Thomson | 322/45 |
| 5,759,424 A | | 6/1998 | Imatake et al. | 216/60 |
| 5,770,023 A | | 6/1998 | Sellers | 204/192.3 |
| 5,796,214 A | | 8/1998 | Nerone | 315/209 R |
| 5,810,982 A | | 9/1998 | Sellers | 204/298.08 |
| 5,831,851 A | | 11/1998 | Eastburn et al. | 364/167.01 |
| 5,842,154 A | * | 11/1998 | Harnett | 702/106 |
| 5,844,369 A | * | 12/1998 | Yoshizako et al. | 315/111.21 |
| 5,929,610 A | | 7/1999 | Friedlander et al. | 322/37 |
| 6,001,224 A | | 12/1999 | Drummond et al. | 204/192.12 |
| 6,020,794 A | * | 2/2000 | Wilbur | 333/17.1 |
| 6,072,302 A | * | 6/2000 | Underwood et al. | 322/17 |
| 6,130,523 A | * | 10/2000 | Hughes et al. | 322/45 |
| 6,175,217 B1 | * | 1/2001 | Da Ponte et al. | 322/19 |
| 6,291,999 B1 | | 9/2001 | Nishimori et al. | 324/464 |
| 6,316,918 B1 | * | 11/2001 | Underwood et al. | 322/20 |
| 6,358,573 B1 | * | 3/2002 | Raoux et al. | 427/578 |
| 6,380,719 B2 | * | 4/2002 | Underwood et al. | 322/36 |
| 6,383,554 B1 | | 5/2002 | Chang et al. | 427/10 |
| 6,411,065 B1 | * | 6/2002 | Underwood et al. | 322/20 |
| 6,459,067 B1 | * | 10/2002 | Vona et al. | 219/121.54 |
| 6,472,822 B1 | * | 10/2002 | Chen et al. | 315/111.21 |
| 6,521,099 B1 | | 2/2003 | Drummond et al. | 204/192.12 |
| 6,524,455 B1 | | 2/2003 | Sellers | 204/298.08 |
| 6,703,080 B2 | * | 3/2004 | Reyzelman et al. | 427/445 |
| 6,738,692 B2 | * | 5/2004 | Schienbein et al. | 700/286 |
| 6,772,051 B2 | * | 8/2004 | Nagafuchi et al. | 700/287 |
| 2003/0213559 A1 | | 11/2003 | Goodman | 156/345.28 |

FOREIGN PATENT DOCUMENTS

| | | |
|---|---|---|
| EP | 0 957 184 | 11/1999 |
| JP | 7-188919 | 7/1995 |

OTHER PUBLICATIONS

Chapman, *Glow Discharge Processes, Sputtering and Plasma Etching*, (1980) Chapter 2 "Gas Phase Collision Processes," pp. 21-49.

Boxman et al, *Handbook of Vacuum Arc Science and Technology, Fundamentals and Applications*, (1995) "Foreword", pp. vii-viii, "Preface" pp. ix-xv, and Chapter 2, "Arc Ignition," pp. 28-72.

International Search Report for International Patent Application Serial No. PCT/US2004/026684, dated May 10, 2005 (11 pages).

* cited by examiner

CONTROL SYSTEM FOR A SPUTTERING SYSTEM

FIELD OF THE INVENTION

The invention generally relates to fault handling systems in the field of plasma sputtering. In particular, the invention relates to a fault handling system and methods for controlling operation of a power generator used in a sputtering system.

BACKGROUND OF THE INVENTION

Plasma sputtering processes are extensively used in the semiconductor, flat panel, data storage, hard coating and industrial glass coating industries. In a sputtering process atoms of a material are liberated from a target material and deposited onto a substrate. In a reactive sputtering process, alternatively, atoms of a material are liberated from a target material allowing the atoms to react with a gas to form a coating that is, subsequently, deposited onto a substrate. In the semiconductor industry a reactive sputtering process may be employed, for example, to deposit a dielectric insulating layer (such as, silicon nitride) onto a silicon wafer. In the hard coating industry, a reactive sputtering process may be used, for example, to deposit a wear-resistant layer (such as, titanium nitride) on a mechanical part.

Sputtering is a vacuum deposition process in which a sputtering target is bombarded with ions, typically an ionized noble gas, and momentum transfer mechanically frees the atoms of the target material. The target material then coats a nearby substrate.

In a reactive sputtering process a reactive gas is introduced into the sputtering chamber and the atoms of the freed target material react with the reactive gas to form a coating material. For example, the target material can be aluminum and the reactive gas can be oxygen, the combination of which produces a coating of aluminum oxide. In another example, carbonaceous gas (such as, acetylene) can be used as the reactive gas to produce coatings such as silicon carbide and tungsten carbide by combining the acetylene with silicon and tungsten targets, respectively. The conductive atoms of freed target material react with the reactive gas in a plasma in the sputtering chamber to produce the compound (coating material) that coats the substrate.

Proper control of sputtering process parameters (such as, voltage and current supplied to the plasma chamber by a power generator) is important to ensure that adequate sputtering quality and system throughput is achieved. Sputtering system faults (such as, warning or error signals) may occur during operation. These faults are indicative of problems in the sputtering process or the onset of problems that may have adverse effects on the sputtering process. One such fault occurs when the power generator of a sputtering system outputs a voltage that is below a specified threshold; this condition can result in fewer or zero atoms of target material being freed from the target. Further, another such fault occurs when the power generator outputs a current density to the plasma chamber above a specified threshold value; this condition can result in arcing and subsequent termination of the sputtering process due to the presence of the arcing.

Control systems for conventional sputtering systems react to the occurrence of individual faults. Multiple faults, however, may occur within a short period of time during the operation of the sputtering system. A control system's reaction to each of the individual faults may not be optimum where there are multiple faults.

A fault handling system and methods for controlling the operation of a power generator of a sputtering system in the presence of multiple sputtering system faults are therefore needed.

SUMMARY OF THE INVENTION

The invention, in one aspect, provides a method for controlling the operation of a sputtering system.

In another aspect, the invention relates to a method of controlling the operation of a power generator. This method involves receiving a plurality of fault status signals from a sputtering system within a period of time, processing the plurality of fault status signals with a fault handling algorithm, and generating at least one command signal for affecting operating characteristics of a power generator of the sputtering system.

The method of controlling the operation of the power generator in various embodiments involves modifying parameters of the fault handling algorithm during operation of the power generator. The parameters of the fault handling algorithm software in some embodiments are modified prior to compilation of system software. In alternative embodiments, the parameters of the fault handling algorithm are modified without recompiling source code. In alternative embodiment, the fault status signals correspond to one or more fault types.

Processing the fault status signals with the fault handling algorithm in some embodiments involves performing linear algebra computations and/or mathematical operations. The mathematical operations can include the operands: AND, OR, XOR, NOT, multiplication, addition, subtraction, and division, equal to, greater than, less than, not equal to, greater than or equal to, less than or equal to, maximum, and minimum.

The method of controlling the operation of the power generator in various embodiments includes storing the fault handling algorithm in a memory and/or retrieving the algorithm from a memory. The method in some embodiments involves generating a plurality of command signals. These command signals in some embodiments are simultaneously generated. In some embodiments the plurality of fault status signals are simultaneously processed with the fault handling algorithm. The method is used to control a direct current "DC" power generator in some embodiments and a radio frequency "RF" power generator in others.

In general, in another aspect, the invention involves a fault handling system for controlling a power generator of a sputtering system. The fault handling system comprises a processor that is in signal communication with the power generator. The processor receives a plurality of fault status signals from a sputtering system within a period of time and generates at least one command signal to affect operating characteristics of the power generator by processing the plurality of fault status signals with a fault handling algorithm.

Embodiments of the foregoing aspects of the invention may include one or more of the following features. Parameters of the fault handling algorithm can be specified by an operator during operation of the sputtering system. Parameters of the fault handling algorithm may be modified without recompilation of source code. Processing the plurality of fault status signals with the fault handling algorithm involves performing linear algebra computations and/or mathematical operations. The mathematical operations performed include one or more of the operands: AND, OR, XOR, NOT, multiplication, addition, subtraction, and division, equal to, greater than, less than, not equal to, greater than or equal to, less than or equal to, maximum, and minimum.

Embodiments of the foregoing aspects of the invention may include the following features. The processor is a component in the power generator. The fault handling system includes a memory for storing the fault handling algorithm and from which the algorithm may be retrieved. The plurality of fault status signals may comprise a vector of fault status signals. In alternative embodiment, the fault status signals correspond to one or more fault types. The processor is capable of generating a plurality of command signals. These command signals can be simultaneously generated. The plurality of fault status signals can be simultaneously processed with the fault handling algorithm. The fault handling system includes a user interface that is in signal communication with the processor. The user interface can be used for modifying the fault handling algorithm. The fault handling system controls the power generator. The fault handling systems can be used to control a DC power generator or RF power generator. The operating characteristics of the power generator that can be affected by the fault handling system include system output disable, power block output disable, output enable prevent, and output drive rollback voltage.

In general, in another aspect, the invention involves a fault handling system for controlling a power generator of a sputtering system. The fault handling system comprises a means for receiving a plurality of fault status signals from a sputtering system within a period of time and a means for generating at least one command signal to affect operating characteristics of the power generator based upon the plurality of fault status signals and a fault handling algorithm.

The foregoing and other objects, aspects, features, and advantages of the invention will become more apparent from the following description and from the claims.

BRIEF DESCRIPTION OF THE DRAWINGS

The foregoing and other objects, feature and advantages of the invention, as well as the invention itself, will be more fully understood from the following illustrative description of the invention, when read together with the accompanying drawings which are not necessarily to scale.

DETAILED DESCRIPTION OF ILLUSTRATIVE EMBODIMENTS

Figure 1:
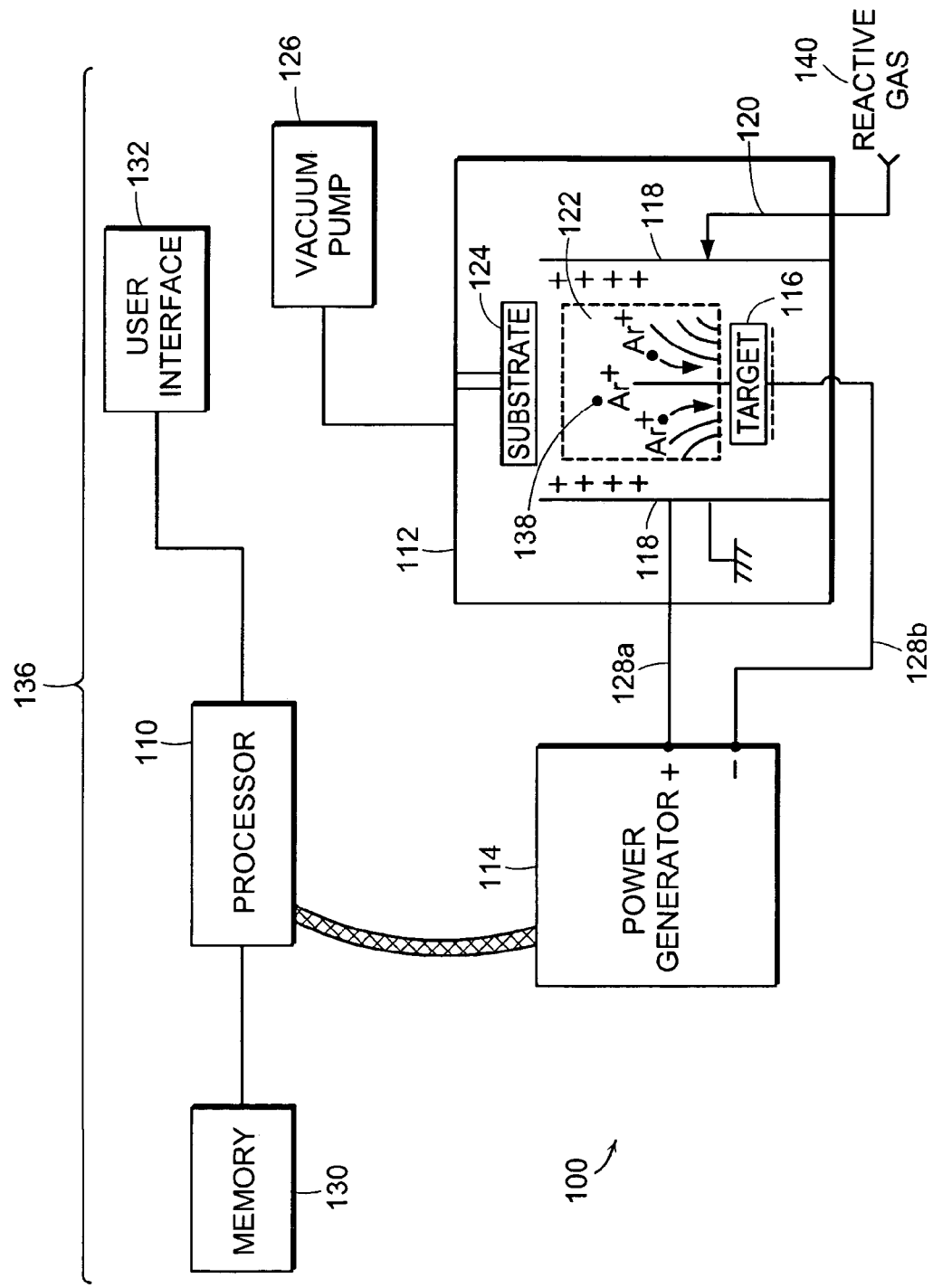
FIG. 1 is a schematic view of a processor in communication with a power generator of a sputtering system according to an illustrative embodiment of the invention.

FIG. 1 illustrates one embodiment of a fault handling system 136 used to control a sputtering system 100 according to the invention. The sputtering system 100 includes a plasma chamber 112 and a power generator 114. The fault handling system includes a processor 110 that is in signal communication with a memory 130 and a user interface 132. The processor 110 generates one or more command signals based upon a fault handling algorithm and a plurality of fault status signals to affect the operation of the power generator 114. It is helpful to understand the operation of the sputtering system 100 to more fully describe the associated fault handling system 136.

During a typical operation of the sputtering system 100, the pressure in the plasma chamber 112 is adjusted by a vacuum pump 126 while a controlled amount of a noble gas, for example, argon gas is introduced. Positively charged argon ions 138 ($Ar^+$) are accelerated during operation by a field towards a target 116 (also referred to as a cathode) located within the plasma chamber 112, where the positive ions 138 combine with electrons in the target 116. The field (for example, a steady-state field) is created by and exists between an anode 118 connected to the positive terminal of the power generator 114 and the target 116 (cathode) connected to the negative terminal of the power generator 114 by electrical connections 128a and 128b, respectively. The target 116 may, for example, be fabricated from aluminum, gold, platinum, or titanium.

To achieve a sputtering effect, the positively charged argon ions 138 are made energetic enough so that their kinetic energy will knock atoms of the target material off the target 116 when the argon ions 138 collide with the target 116. In this embodiment, a reactive sputtering system is described. Other types of sputtering systems also are contemplated in which, for example, no reactive gas is used and the freed atoms of target material are used to coat a substrate. The atoms of target material freed from the target 116 then enter a plasma 122 located within the plasma chamber 112 where the atoms of target material react with a reactive gas 140 (for example, oxygen, borane, acetylene, ammonia, silane, or arsene) supplied by a gas conduit 120 to the sputtering chamber 112. The resultant product (coating material) of the reaction of the freed atoms of the target material and the reactive gas 140 is deposited on any available surface within the plasma chamber 112. It is preferable, however, that the coating material be deposited only upon a substrate 124 located within the plasma chamber 112. The coating material deposited on the target 116 and other surfaces of the plasma chamber 112 can, for example, result in arcing in the sputtering chamber 112.

Control of the sputtering process requires control of, for example, voltage, current flow, and current density as delivered from the power generator 114 to the plasma 122 within the plasma chamber 112.

In this illustrative embodiment of the invention, the operation of the power generator 114 (e.g., control of output voltage or current density) is controlled using a processor 110 of the fault handling system 136. The processor 110 is in signal communication with the power generator 114 of the sputtering system 100. The user interface 132 in signal communication with the processor 110 is used to monitor, control, and/or affect operation of the fault handling system 136 and the sputtering system 100.

In alternative embodiments, the operation of the power generator 114 is controlled by a controller or processor that is independent from the processor 110 of the fault handling system 136. The controller or processor in some embodiments is also used to monitor and/or control the sputtering system 100. The controller or processor in these embodiments can be an independent component of the sputtering system 100 or a component within the power generator 114.

In the illustrative embodiment, power generator 114 is a DC power generator that creates a voltage potential between two connectors. Each of the two connectors are coupled to the plasma chamber 112 creating positive electrical connection 128a and a negative electrical connection 128b between the power generator 114 and the plasma chamber 112. The processor 110 is capable of generating command signals to affect the operating characteristics of the power generator 114, and by extension the sputtering process in the plasma chamber 112. For example, a command signal for the power generator 114 to supply more current to the plasma chamber 112, will generally cause more ions 138 to collide with the target 116 and free atoms of target material. The free atoms will enter the plasma 122 in the plasma chamber 112 at a higher rate, thereby affecting the deposition of coating material upon the substrate 124.

In an alternative embodiment, the power generator is an RF generator. An RF generator is a power generator that provides electrical power to the plasma chamber at a frequency, within a range, e.g., from about 0.08 MHz to about 100 MHz. By way of example, the power generator might be an RF power generator, such as a Mid-Frequency RF Generator model NOVA-25 manufactured by ENI Technology, Inc. with offices in Rochester, N.Y. The RF power generator provides an alternating potential to the cathode and anode of the plasma chamber. The RF power generator can sometimes reduce the risk of arcing and achieve higher deposition rates than a DC power generator.

Different target materials require different levels of applied voltage to free atoms from the target 116. For example, a target composed of gold requires a more energetic positive ion to free the atoms from the target 116 than a target composed of aluminum requires. For comparison, about −700 volts is required to free gold atoms from a target composed of gold whereas about −450 volts is required to free aluminum atoms from a target composed of aluminum.

Figure 2:
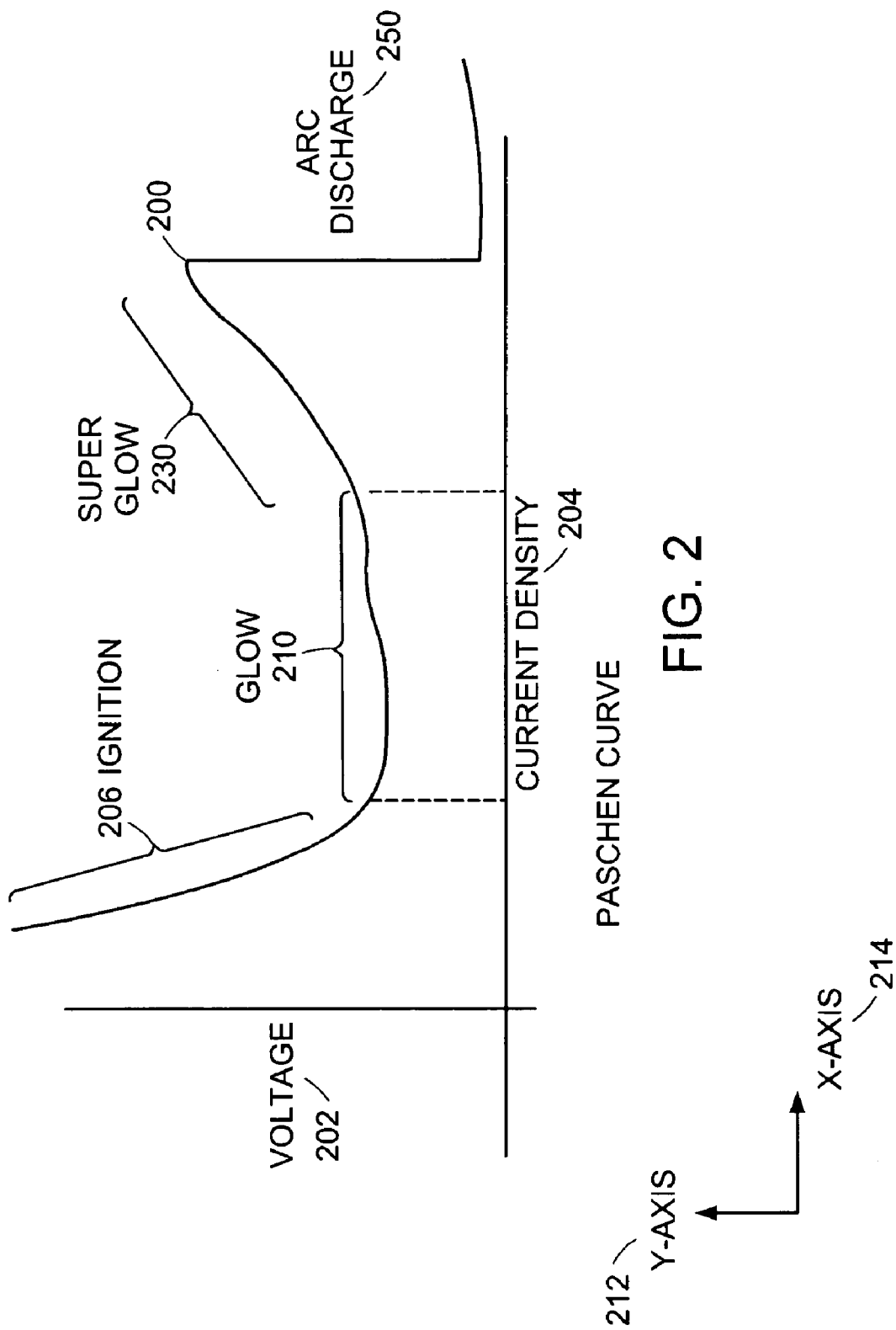
FIG. 2 is a Paschen curve of voltage versus current density, showing various operating condition regions of a plasma in a sputtering operation.

The current density supplied by the power generator 114 to the plasma chamber 112 is also an important sputtering process parameter. It affects the rate at which the coating material is deposited on the substrate 124. The risk of arc discharge also increases with the current density. Typically, an upper limit on the deposition rate is defined by an upper limit on current density. The upper limit on current density supplied by the power generator 114 to the plasma 122 is sometimes defined by a Paschen curve, such as illustrated in FIG. 2. The Paschen curve 200 of FIG. 2 illustrates the relationship between voltage 202 and current density 204 for plasma in a sputtering system with specific properties (e.g., type of target material, reactive gas, desired deposition rate, etc.).

The sputtering process is initiated by an ignition stage 206, during which nominal operating conditions are established in the sputtering system. Sputtering is usually conducted under plasma operating conditions within the "glow" region 210 of the FIG. 2 Paschen curve 200. The plasma 122 enters the "superglow" region 230 of the Paschen curve 200 when current density 204 and voltage 202 is increased above the glow level. In the superglow region 230, the plasma 122 acts to limit movement of argon ions across the plasma 122. This results in an increased voltage 202 across the plasma 122 (and corresponding increase in breakdown voltage as illustrated by the Y-axis 212 of the FIG. 2 Paschen curve 200).

As the operating conditions of the plasma 122 extend beyond the superglow region 230 into an arc discharge region 250 of the Paschen curve 200 (in the positive direction along the X-axis 214), the current density 204 becomes so high that the plasma 122 heats the argon ions. Heating of the argon ions in the arc discharge region results in the generation of thermal electrons and photons that results in runaway ionization. Left uncontrolled, runaway ionization further increases the number of ions in the plasma 122 resulting in a drop in the impedance of the plasma 122 and a subsequent increase in current. This produces a region of negative resistance in the plasma 122 (in the location that the thermal electrons and photons are generated) which is prone to arcing (where the plasma 122 impedance is low and current is only limited by the output impedance of the power generator 114). In the event that arcing occurs, undesirable effects can occur to the target 116, such as pitting, flaking, cracking, and localized heating of the target material. Further, at the onset of arcing, sputtering of the coating material on the substrate terminates.

The invention, in one aspect, is directed to a fault handling system for controlling the operation of a power generator, such as the power generator 114 of FIG. 1. In accordance with the invention, a processor, such as the processor 110 of FIG. 1, generates command signals to affect the operation of the power generator 114. In the embodiment of FIG. 1, a memory 130 is in signal communication with the processor 110. The memory 130 is used to store a fault handling algorithm prior to operation of the sputtering system. The memory 130 may, for example, be a flash memory device capable of storing computer code, such as the fault handling algorithm. In an alternative embodiment, the fault handling algorithm is resident in a memory in the processor 110. In the embodiment of FIG. 1, a user interface 132 is in signal communication with the processor 110. The operator can use the user interface 132 to, for example, monitor the performance of the power generator 114 and/or modify parameters of the fault handling algorithm stored in the memory 130. In one embodiment of the invention, an operator modifies parameters of the fault handling algorithm without recompiling computer source code.

In one embodiment, the processor 110 is part of a computer system with a display whereby an operator may monitor and or modify the operating characteristics of the power generator 114. In an alternative embodiment, the processor 110 is a component of the power generator 114.

In one illustrative embodiment of the invention, the fault control system 136 of FIG. 1 is adapted for controlling the operation of a power generator 114. The fault control system 136 receives a plurality of fault status signals from a sputtering system 100 within a period of time. The plurality of fault status signals are processed with a fault handling algorithm and processor 110 generates at least one command signal that affects the operating characteristics of the power generator 114. In such an embodiment, the processor 110 may receive the plurality of fault status signals from the power generator 114 of the sputtering system 100.

In an alternative embodiment, the power generator 114 includes a separate processor in signal communication with the processor 110 of the fault handling system 136. The separate processor controls the operation of the power generator 114. In such an embodiment, the separate processor may receive control commands from the processor 110 of the fault handling system 136.

The plurality of fault status signals represent those fault signals that occur within a period of time (fixed or variable) during which the sputtering system 100 is operating. In one embodiment, the period of time is fixed. For example, the plurality of fault status signals may be all such signals received during one clock cycle of the processor 110. A clock cycle in one such embodiment is nine microseconds. Based on the fault status signals received and the fault handling algorithm, the processor 110 generates at least one command signal for affecting the operating characteristics of the power generator 114. After the processor 110 generates one or more appropriate command signals and the next period of time has elapsed, the processor 110 may have new fault status signals to process. This new set of fault status signals represents the faults status signals that occur during a subsequent clock cycle of the processor 110. The new set of fault status signals may be different than a prior set of fault status signals if operating conditions of the sputtering system 100 have changed. Further, in this manner, the fault handling system 136 may generate a new or updated set of command signals in response to a plurality of fault status signals.

The fault handling algorithm of the present invention is designed to process m fault status signals collected as a vector:

$$FS = \begin{bmatrix} F_1 \\ F_2 \\ \vdots \\ F_m \end{bmatrix}. \tag{1}$$

Each fault status signal $F_m$ corresponds to a specific fault that may be generated by the sputtering system 100 or a subsystem thereof. For example, when the output voltage of the power generator 114 exceeds a threshold voltage, a fault will be generated. An operator using a fault handling system in accordance with the invention may specify the threshold voltage based on a Paschen curve as one shortly below the voltage at which arc discharge will occur. In this manner, the operator can set the fault as a warning to the fault handling system 136 that arc discharge may soon occur.

Fault status signals may be encountered in a sputtering system for various parts of the system. For example, fault status signals may include, but not be limited to: safety interlock indicator, unable to reach setpoint, sensing of an arc in the plasma chamber, voltage drain to source (VDS), sense block cable disconnected, system unable to ignite plasma, power generator output voltage greater than specified limit, power generator output current greater than specified limit, power generator output current density greater than specified limit, and flux sensor in plasma chamber records flux measurement greater than a specified limit, and number of minutes of target use in sputtering exceeds a specified limit.

In general, the processor 110 of FIG. 1 processes each of the fault status signals $F_m$ with the fault handling algorithm FHA to determine action to be taken in response to the signals. Based on the fault status signals $F_m$ the fault handling algorithm FHA will initially generate n command signals relating to the operation of the power generator 114. The command signals $CS_n$ are collected as a vector:

$$CS = \begin{bmatrix} CS_1 \\ CS_2 \\ \vdots \\ CS_n \end{bmatrix}. \tag{2}$$

Various command signals may be generated by a fault handling system in a sputtering system. For example, generated command signals may include, but not be limited to: control of output voltage, current, current density output by a power generator, modifying the flow rate of noble gas or reactive gas supplied to the plasma chamber, modifying the operating parameters of an RF power generator, and modifying the operating parameter of a DC power generator.

In some embodiments, implementation of the fault handling algorithm to generate the command signal vector CS involves performing at least one mathematical operation on the fault status signal vector FS.

In some embodiments, the fault handling algorithm employs a fault handling matrix FM:

$$FM = \begin{bmatrix} FM_{11} & FM_{12} & \cdots & FM_{1m} \\ FM_{21} & \cdots & \cdots & \cdots \\ \cdots & \cdots & \cdots & \cdots \\ FM_{nl} & \cdots & \cdots & FM_{nm} \end{bmatrix}, \tag{3}$$

where $FM_{nm}$ represents the fault handling matrix parameter associated with command signal n in response to fault status signal m. In these embodiments, generating the command signal vector CS involves multiplying the fault handling matrix FM with the fault status signal vector FS:

$$CS = \begin{bmatrix} CS_1 \\ CS_2 \\ \vdots \\ CS_n \end{bmatrix} = \begin{bmatrix} FM_{11} & FM_{12} & \cdots & FM_{1m} \\ FM_{21} & \cdots & \cdots & \cdots \\ \cdots & \cdots & \cdots & \cdots \\ FM_{nl} & \cdots & \cdots & FM_{nm} \end{bmatrix} \times \begin{bmatrix} F_1 \\ F_2 \\ \vdots \\ F_m \end{bmatrix}, \tag{4}$$

where the resultant command signal vector CS would have the following values:

$$CS = \begin{bmatrix} CS_1 \\ CS_2 \\ \vdots \\ CS_n \end{bmatrix} = \begin{bmatrix} FM_{11}F_1 + FM_{12}F_2 + \ldots FM_{1m}F_m \\ FM_{21}F_1 + FM_{22}F_2 + \ldots FM_{2m}F_m \\ \vdots \\ FM_{nl}F_1 + FM_{n2}F_2 + \ldots FM_{nm}F_m \end{bmatrix}. \tag{5}$$

In these embodiments of the invention, implementation of the fault handling algorithm can involve performing mathematical operations (for example, linear algebra computations) using the fault status signal vector FS (equation 1) and the parameters of the fault handling matrix FM (equation 3). The mathematical operations performed can include (but is not limited to) the following logical and mathematical operands: AND, OR, XOR, NOT, multiplication, addition, subtraction, and division, equal to, greater than, less than, not equal to, greater than or equal to, less than or equal to, maximum, and minimum.

In one such embodiment, implementation of the fault handling algorithm to generate the command signal vector CS involves the following mathematical operations:

$$CS = \begin{bmatrix} CS_1 \\ CS_2 \\ \vdots \\ CS_n \end{bmatrix} = \begin{bmatrix} \text{maximum}(FM_{11}F_1 & FM_{12}F_2 & \cdots & FM_{1m}F_m) \\ \text{maximum}(FM_{21}F_1 & FM_{22}F_2 & \cdots & FM_{2m}F_m) \\ \vdots \\ \text{maximum} FM_{nl}F_1 & FM_{n2}F_2 & \cdots & FM_{nm}F_m) \end{bmatrix}. \tag{6}$$

In this embodiment the processor 110 determines which element $FM_{nm}F_m$ is a maximum for each command signal $CS_n$; each maximum value is then designated a command signal. As this embodiment illustrates, the fault handling algorithm may generate a single command signal in response to the plurality of fault status signals. This occurs, for example, when n=1 (the vector $CS=CS_1$ and the matrix $FM=(FM_{11}F_1\ FM_{12}F_2\ \ldots\ FM_{1m}F_m)$.

Figure 3:
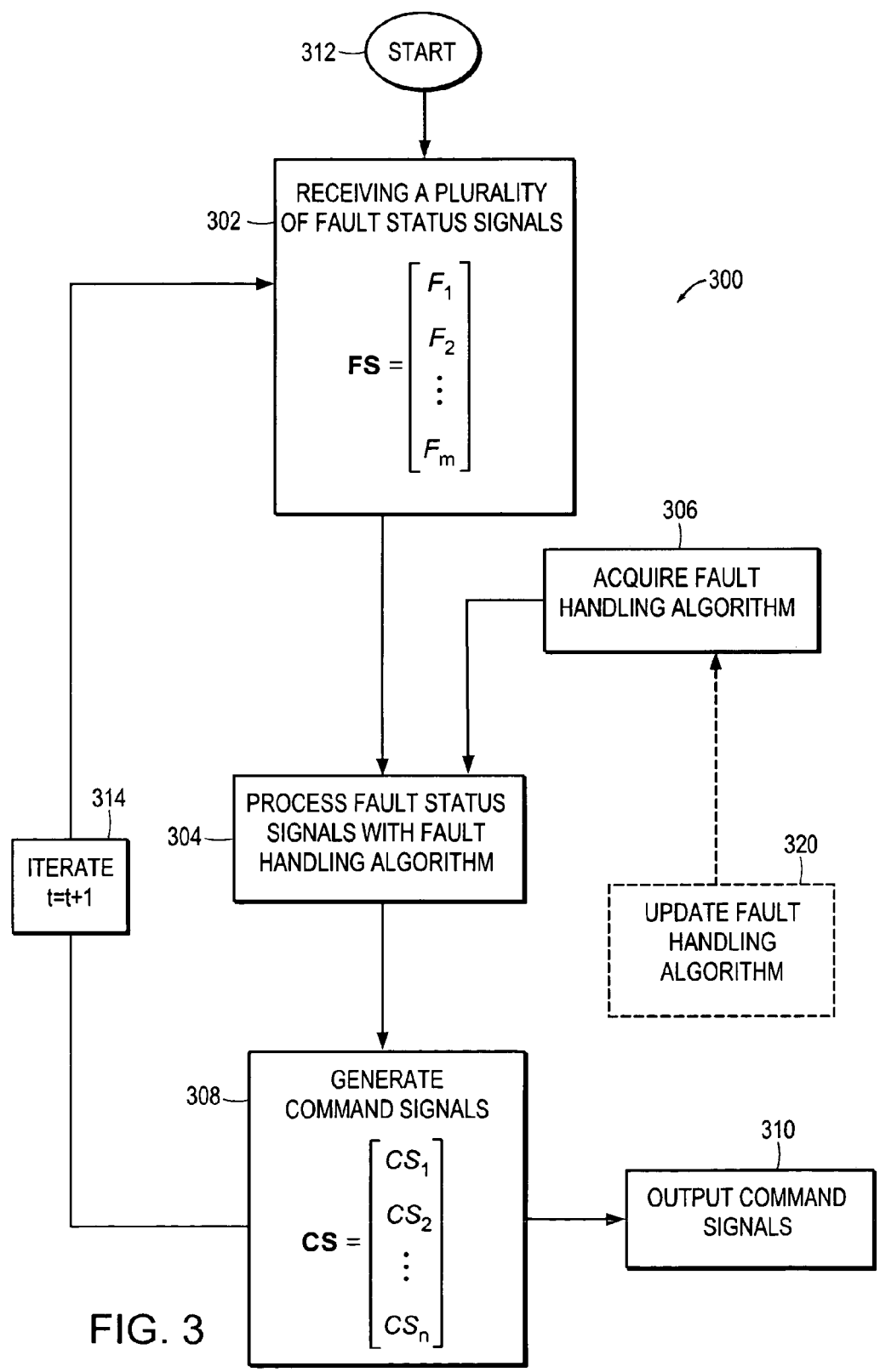
FIG. 3 is a flowchart depicting a computer implementation of an illustrative embodiment of the method according to the invention.

FIG. 3 is a flowchart 300 depicting a method for controlling a power generator in accordance with the invention. The method of FIG. 3 starts 312 and then begins with step 302 receiving a plurality of fault status signals within a period of time. The plurality of fault status signals in one embodiment of step 302 are represented by a fault status signal vector.

In one implementation of the method of FIG. 3, a fault handling algorithm is acquired in step 306, for example, from a memory, such as the memory 130 of FIG. 1. In step 304 of FIG. 3, the fault status signals are processed with the fault handling algorithm. In step 308 at least one command signal is generated. In an alternative embodiment, the step 306, acquiring the fault handling algorithm is optional and the algorithm is already stored in a processor used to process the fault status signals with the fault handling algorithm.

In this embodiment of the invention, the command signals are simultaneously generated 308 by the processor and subsequently output 310 to the power generator. The command signals may, alternatively, be output to the power generator at the end of a system clock cycle after the processor has completed the mathematical operations associated with implementing the fault handling algorithm.

After the step 308 where the command signals are generated, some or all steps of the method may be repeated according to step 314. In this embodiment, the method of FIG. 3 repeats step 302 by receiving a plurality of fault status signals within a period of time (period of time is equal to t+1). In alternative embodiments of the invention, other steps or combinations of steps of the method may be repeated.

An optional step in the method involves the step 320 of updating the fault handling algorithm. The step of updating may, for example, be performed by an operator during operation of the sputtering system. The operator may update the fault handling algorithm by modifying parameters of the fault handling algorithm without recompiling software associated with the algorithm. In one example, an operator may update parameters of the fault handling algorithm based upon changes identified in a Paschen curve, such as the Paschen curve 200 of FIG. 2. In this example, the operator may change the parameters to ensure that command signals for altering a current density supplied by the power supply to the plasma chamber are below a threshold level to ensure that arc discharge does not occur.

In one embodiment, the method of FIG. 3 according to the invention, involves receiving a plurality of fault status signals represented by the vector below:

$$FS = \begin{bmatrix} F_1 \\ F_2 \\ F_3 \\ F_4 \\ F_5 \\ F_6 \end{bmatrix} = \begin{bmatrix} 0 \\ 1 \\ 1 \\ 0 \\ 0 \\ 0 \end{bmatrix}. \quad (7)$$

In the exemplary fault status vector, $F_1$ equals a value of zero, indicating that no fault exist for a safety interlock fault indicator; $F_2$ has a value of one indicating the power generator 114 is unable to reach an established setpoint; $F_3$ has a value of one indicating an arc has been sensed in the plasma chamber 112; $F_4$ has a value of zero indicating that no fault exists for whether there is a voltage drain to source (VDS); $F_5$ has a value of zero indicating the sense block cable is not disconnected; and $F_6$ has a value of zero indicating no fault exists for whether the system can ignite a plasma.

The invention processes the fault status signal vector equation (7) with the fault handling algorithm. The embodiment of the invention receiving the fault status signal vector above comprises a fault handling algorithm FHA that features a fault handling matrix FM with the parameter values shown below:

$$FM = \begin{bmatrix} FM_{11} & \cdots & FM_{16} \\ \vdots & \cdots & \vdots \\ FM_{41} & \cdots & FM_{46} \end{bmatrix} = \begin{bmatrix} 1 & 0 & 0 & 0 & 1 & 0 \\ 1 & 0 & 1 & 1 & 1 & 0 \\ 1 & 0 & 0 & 1 & 1 & 0 \\ 0 & 400 & 200 & 0 & 0 & 0 \end{bmatrix}. \quad (8)$$

In this case, some of the parameter values have a physical meaning. For example, the parameter values for $FM_{42}$ and $FM_{43}$ represent voltage levels 400 volts and 200 volts, respectively, that the fault algorithm may command a power generator to output to a plasma chamber.

In this case, four command signals for affecting the operation of the power generator are generated as described below.

$$CS = \begin{bmatrix} CS_1 \\ CS_2 \\ CS_3 \\ CS_4 \end{bmatrix} = \begin{bmatrix} FM_{11}F_1 + FM_{12}F_2 + FM_{13}F_3 + FM_{14}F_4 + FM_{15}F_5 + FM_{16}F_6 \\ FM_{21}F_1 + FM_{22}F_2 + FM_{23}F_3 + FM_{24}F_4 + FM_{25}F_5 + FM_{26}F_6 \\ FM_{31}F_1 + FM_{32}F_2 + FM_{33}F_3 + FM_{34}F_4 + FM_{35}F_5 + FM_{36}F_6 \\ \text{maximum}(FM_{41}F_1, FM_{42}F_2, FM_{43}F_3, FM_{44}F_4, FM_{45}F_5, FM_{46}F_6) \end{bmatrix} = \begin{bmatrix} 0 \\ 1 \\ 0 \\ 400 \end{bmatrix}, \quad (9)$$

where $CS_1=0$ indicates that no command signal will be generated to disable the entire power generator 114, $CS_2=1$ is a command signal that does disable the DC output of the power generator, $CS_3=0$ indicates that no command signal will be generated to prevent an operator from enabling the DC output (changing $CS_2$ to equal zero), and $CS_4=400$ is a command signal that causes the power generator 114 to reduce (roll back) the output signal of the power generator 114 to 400 volts.

Figure 4:
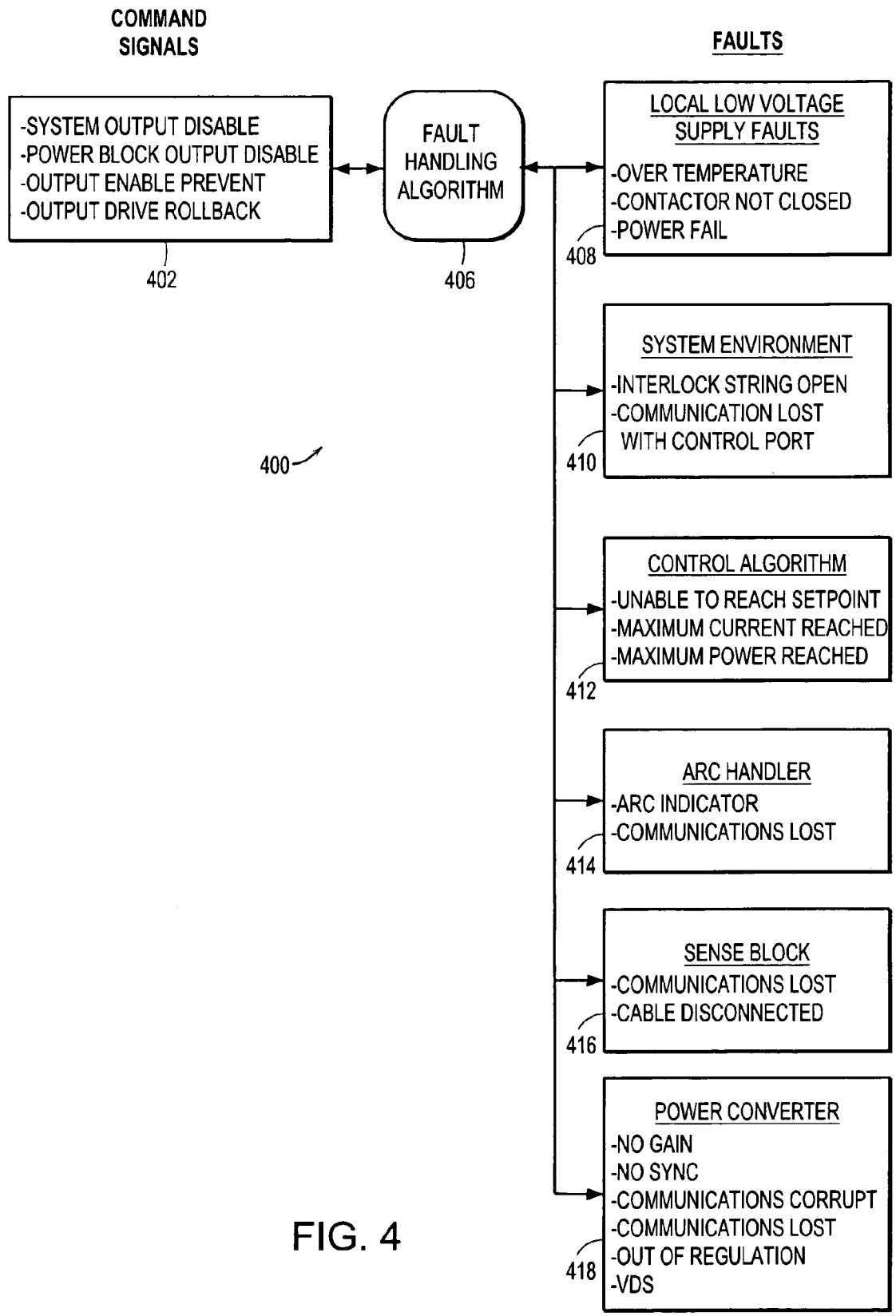
FIG. 4 is a diagram depicting a plurality of faults, a fault handling algorithm, and command signals according to an illustrative embodiment of the invention.

FIG. 4 is a diagram 400 illustrating a relationship between a fault handling algorithm 406, specific fault types 408–418, and specific command signals 402. As FIG. 4 illustrates, the fault handling algorithm 406 may be provided with a plurality of faults and a variety of types of faults. FIG. 4 illustrates six types of faults. These fault types are Local Low Voltage Supply faults 408, System Environment faults 410, Control Algorithm faults 412, Arc Handler faults 414, Sense Block faults 416, and Power Converter faults 418.

Each of the fault types may occur under a variety of conditions. A Local Low Voltage Supply fault 408 may occur, for example, if the supply temperature is over a specified value, if an electrical contactor is not closed, or in the event of a power failure. A System Environment fault 410 may occur in the presence of an open interlock string or if communication with a control port is lost. A Control Algorithm fault 412 may occur, for example, if the power generator is unable to reach a specified setpoint, reaches a maximum current, or reaches a maximum power. The Arc Handler fault 414 may occur, for example, if an arc occurs or communication with an arc handler circuit is lost. The Sense Block fault 416 may occur if communication between a processor and a sense block is lost or if a sense block cable is disconnected. Faults relating to a Power Converter 418 in FIG. 4 may occur if no gain on the signal is measured in the power converter, the power converter is not synchronized, communications with the power converter are determined to be corrupt, communication with the power converter is lost, if the power converter is determined to be out of regulation, or due to the occurrence of VDS.

The fault handling algorithm 406 of FIG. 4 is capable of generating up to four command signals 402 in response to the plurality of fault status signal types 408–418. The command signals 402 include system output disable, power block output disable, output enable prevent, and output drive rollback. Command signals may have a binary form (i.e. specify whether to disable something) or a scalar form (i.e. decrease voltage by a particular amount). A fault handling algorithm 406 such as illustrated in FIG. 4 may be used in embodiments of the method of FIG. 3 and/or embodiments of the fault handling system 136 of FIG. 1.

Variations, modifications, and other implementations of what is may be employed without departing from the spirit and the scope of the invention. Accordingly, the invention is not to be defined only by the preceding illustrative description, but instead by the appended claims and equivalents thereof.

What is claimed is:

1. A method for controlling the operation of a power generator, comprising:
   receiving a plurality of fault status signals from a sputtering system within a period of time;
   processing the plurality of fault status signals with a fault handling algorithm; and
   generating at least one command signal for affecting operating characteristics of a power generator.

2. The method of claim 1 further comprising modifying parameters of the fault handling algorithm during operation of the power generator.

3. The method of claim 2, wherein the parameters of the fault handling algorithm are modified without recompiling source code.

4. The method of claim 1, wherein the step of processing comprises performing linear algebra computations.

5. The method of claim 1, wherein the step of processing comprises performing mathematical operations.

6. The method of claim 5, wherein the mathematical operations are selected from the group consisting of AND, OR, XOR, NOT, multiplication, addition, subtraction, division, equal to, greater than, less than, not equal to, greater than or equal to, less than or equal to, maximum, and minimum.

7. The method of claim 1 further comprising storing the fault handling algorithm in a memory.

8. The method of claim 1 further comprising retrieving the fault handling algorithm from a memory.

9. The method of claim 1, wherein the at least one command signal comprises a plurality of command signals.

10. The method of claim 9, wherein the plurality of command signals are simultaneously generated.

11. The method of claim 1, wherein the plurality of fault status signals are simultaneously processed with the fault handling algorithm.

12. The method of claim 1, wherein the power generator is a DC power generator.

13. The method of claim 1, wherein the power generator is an RF power generator.

14. The method of claim 1, wherein the plurality of fault status signals correspond to one or more fault types.

15. A fault handling system for controlling a power generator of a sputtering system, the fault handling system comprising:
   a processor in signal communication with the power generator for receiving a plurality of fault status signals from the sputtering system within a period of time, the processor generating at least one command signal for affecting operating characteristics of the power generator by processing the plurality of fault status signals with a fault handling algorithm.

16. The fault handling system of claim 15, wherein parameters of the fault handling algorithm are specified by an operator during operation of the sputtering system.

17. The fault handling system of claim 15, wherein modifying parameters of the fault handling algorithm does not require recompilation of source code.

18. The fault handling system of claim 15, wherein processing comprises performing linear algebra computations.

19. The fault handling system of claim 15, wherein processing comprises performing mathematical operations.

20. The fault handling system of claim 19, wherein the mathematical operations are selected from the group consisting of AND, OR, XOR, NOT, multiplication, addition, subtraction, and division, equal to, greater than, less than, not equal to, greater than or equal to, less than or equal to, maximum, and minimum.

21. The fault handling system of claim 15, wherein the processor is a component in the power generator.

22. The fault handling system of claim 15 further comprising a memory for storing the fault handling algorithm.

23. The fault handling system of claim 15, wherein the plurality of fault status signals is a vector of signals.

24. The fault handling system of claim 15, wherein a plurality of command signals are generated by the processor.

25. The fault handling system of claim 24, wherein the plurality of command signals are simultaneously generated.

26. The fault handling system of claim 15, wherein the plurality of fault status signals are simultaneously processed with the fault handling algorithm.

27. The fault handling system of claim 15 further comprising a user interface for modifying the fault handling algorithm, the user interface in signal communication with the processor.

28. The fault handling system of claim 15, wherein the fault handling system controls the power generator.

29. The fault handling system of claim 15, wherein the power generator is a DC power generator.

30. The fault handling system of claim 15, wherein the power generator is an RF power generator.

31. The fault handling system of claim 15, wherein the operating characteristics are selected from the group consisting of system output disable, power block output disable, output enable prevent, and output drive rollback percentage.

32. The fault handling system of claim 15, wherein the fault status signals correspond to one or more fault types.

33. A fault handling system for controlling a power generator of a sputtering system, the fault handling system comprising:

a means for receiving a plurality of fault status signals from the sputtering system within a period of time and a means for generating at least one command signal for affecting operating characteristics of the power generator based upon the plurality of fault status signals and a fault handling algorithm.

* * * * *